United States Patent
Wimpenny

(10) Patent No.: US 8,860,510 B2
(45) Date of Patent: Oct. 14, 2014

(54) BIAS CONTROL FOR PUSH-PULL AMPLIFIER ARRANGEMENT

(71) Applicant: Nujira Limited, Cambourne (GB)

(72) Inventor: Gerard Wimpenny, Cambourne (GB)

(73) Assignee: Nujira Limited (GB)

( * ) Notice: Subject to any disclaimer, the term of this patent is extended or adjusted under 35 U.S.C. 154(b) by 40 days.

(21) Appl. No.: 13/849,080

(22) Filed: Mar. 22, 2013

(65) Prior Publication Data
US 2013/0300504 A1 Nov. 14, 2013

(30) Foreign Application Priority Data
Mar. 22, 2012 (GB) .................................. 1205049.8

(51) Int. Cl.
H03F 3/26 (2006.01)
H03F 1/32 (2006.01)
H03F 1/02 (2006.01)

(52) U.S. Cl.
CPC .................. *H03F 3/26* (2013.01); *H03F 3/265* (2013.01); *H03F 2203/45528* (2013.01); *H03F 1/3205* (2013.01); *H06F 1/308* (2013.01); *H03F 1/0272* (2013.01); *H06F 3/45475* (2013.01)
USPC .......................................... 330/274; 330/295

(58) Field of Classification Search
USPC ................................ 330/274, 262, 295, 124 R
See application file for complete search history.

(56) References Cited

U.S. PATENT DOCUMENTS

| 3,094,673 A | * | 6/1963 | Maupin ......................... 330/274 |
| 5,055,797 A | | 10/1991 | Chater |
| 7,477,104 B2 | * | 1/2009 | Kodera ......................... 330/264 |
| 2013/0063211 A1 | * | 3/2013 | Moronvalle et al. .......... 330/262 |

FOREIGN PATENT DOCUMENTS

GB          1257019 A          12/1971

OTHER PUBLICATIONS

"Parent Application GB1205049.8 Search Report", Jul. 19, 2012, Publisher: GB Intellectual Property Office, Published in: GB.

* cited by examiner

*Primary Examiner* — Henry Choe
(74) *Attorney, Agent, or Firm* — Kaplan Breyer Schwarz & Ottesen, LLP

(57) ABSTRACT

An amplification stage comprising: a combiner to generate a sum input signal by combining a voltage signal with a DC bias voltage; a subtractor to generate a difference input signal by subtracting the voltage signal from the DC bias voltage; a first transistor for generating a first part of an amplifier output signal from the sum input signal; a second transistor for generating a second part of an amplifier output signal from the difference input signal; a combiner for combining the first and second parts of the amplifier output signal; a sensing circuit arranged to sense a current flowing in each of the first and second transistors; a control circuit arranged to determine the quiescent current of the first and second transistors in dependence on the sensed currents; and an adjustment circuit arranged to adjust the DC bias voltage in order to minimize variation in the quiescent current.

20 Claims, 9 Drawing Sheets

BIAS CONTROL FOR PUSH-PULL AMPLIFIER ARRANGEMENT

CROSS-REFERENCE TO RELATED APPLICATIONS

British patent application GB 1205049.8, filed on Mar. 22, 2012, is incorporated herein by reference.

BACKGROUND TO THE INVENTION

1. Field of the Invention

The present invention relates to Class AB push-pull amplifier arrangements.

2. Description of the Related Art

Control of the quiescent bias of an output stage of a push-pull Class B amplifier is critical to the amplifier's performance, as it directly influences its crossover distortion and efficiency.

The turn-on voltage of output stage devices typically varies from device to device, and also varies with temperature. The magnitude of the variation is technology dependent, and is particularly large for low cost, high power devices such as MOS switching FETs.

Typically, factory calibration and open loop temperature compensation techniques are used to control the quiescent bias in order to minimise crossover distortion, but for some device classes such techniques are not sufficiently accurate.

The aim of the invention is to provide closed loop control of an output stage quiescent bias by detecting the quiescent current.

SUMMARY OF THE INVENTION

The invention provides a Class AB push pull amplification stage arranged to receive a voltage signal to be amplified and a DC bias voltage, the amplification stage comprising: a combiner to generate a sum input signal by combining the voltage signal with the DC bias voltage; a subtractor to generate a difference input signal by subtracting the voltage signal from the DC bias voltage; a first transistor connected to receive the sum input signal and generate a first part of an amplifier output signal; a second transistor connected to receive the difference input signal and generate a second part of an amplifier output signal; and a combiner for combining the first and second parts of the amplifier output signal, wherein the amplification stage further comprises: a sensing circuit arranged to sense a current flowing in each of the first and second transistors; a control circuit arranged to determine the quiescent current of the first and second transistors in dependence on the sensed currents; and an adjustment circuit arranged to adjust the DC bias voltage in order to minimise variation in the quiescent current.

The control circuit may comprise: first and second non-linear processing blocks for operating on the sensed currents in the respective first and second transistors, wherein each non-linear processing block defines a function for which an output tends to unity as the sensed current in the respective transistor tends to zero, and the output tends to zero as the sensed current in the respective transistor tends to infinity; and a combiner for summing the output of each of the non-linear processing blocks, wherein the summed output only deviates from a fixed value when the amplification stage is operating in a crossover region in which both the first and second transistors are conductive.

The average value of the summed output may depend on the quiescent current of the class AB amplifier.

The first and second non-linear processing blocks each may comprise a current mirror including a reference current generator and a current mirroring transistor arranged to mirror current in the reference current generator, wherein the current in each current mirroring transistor is arranged to also be dependent on one of first and second sensed voltages representing the currents flowing in a respective one of the first and second transistors of the class AB amplifier.

The first and second voltages may be connected between the emitter or source of the respective first and second current mirroring transistors and electrical ground.

The sensing circuit may comprise first and second resistors connected to the first and second transistors of the class AB amplifier for developing the first and second voltages in dependence on the current flowing in the respective transistors.

Each reference current generator may comprise a resistor in series with a diode connected transistor.

The combiner may comprise a resistor connected to the collector or drains of the first and second current mirroring transistors.

The output of the control circuit may be connected to the adjustment circuit, the adjustment circuit being arranged to use the average value of the output of the control circuit to adjust the DC bias voltage so as to minimise the deviation of the output of the control stage from the fixed value in the crossover region.

The amplification stage may further comprise an integrator for determining the average value of the summed output.

The invention also provides a method of controlling the quiescent current of a Class AB push pull amplification stage which is arranged to receive a voltage signal to be amplified and a DC bias voltage, the amplification stage comprising: a combiner to generate a sum input signal by combining the voltage signal with the DC bias voltage; a subtractor to generate a difference input signal by subtracting the voltage signal from the DC bias voltage; a first transistor connected to receive the sum input signal and generate a first part on an amplifier output signal; a second transistor connected to receive the difference input signal and generate a second part of an amplifier output signal; and a combiner for combining the first and second parts of the amplifier output signal, wherein the method comprises: sense a current flowing in each of the first and second transistors; determine the quiescent current of the first and second transistors in dependence on the sensed currents; and adjust the DC bias voltage in order to minimise variation in the quiescent current.

The method may further comprise: applying a non-linear function to each of the sensed currents, for which non-linear function an output tends to unity as the sensed current in the respective transistor tends to zero, and the output tends to zero as the sensed current in the respective transistor tends to infinity; and summing the output of each of the non-linear processing functions, wherein the summed output only deviates from a fixed value when the amplification stage is operating in a crossover region in which both the first and second transistors are conductive.

The average value of the summed output may depend on the quiescent current of the class AB amplifier.

The first and second non-linear processing blocks may each comprise a current mirror including a reference current generator and a current mirroring transistor arranged to mirror current in the reference current generator, the method further comprising arranging the current in each current mirroring transistor to be dependent on one of first and second sensed voltages representing the currents flowing in a respective one of the first and second transistors of the class AB amplifier.

The method may further comprise connecting the first and second voltages between the emitter or source of the respective first and second current mirroring transistors and electrical ground.

The sensing circuit may comprise first and second resistors connected to the first and second transistors of the class AB amplifier, the method further comprising developing the first and second voltages in dependence on the current flowing in the respective transistors.

Each reference current generator may comprise a resistor in series with a diode connected transistor.

The combiner may comprise a resistor connected to the collector or drains of the first and second current mirroring transistors.

The method may further comprise connecting the output of the control circuit to the adjustment circuit, the adjustment circuit being arranged to use the average value of the output of the control circuit to adjust the DC bias voltage so as to minimise the deviation of the output of the control stage from the fixed value in the crossover region.

The method may further comprise the step of determining the average value of the summed output in an integrator.

BRIEF DESCRIPTION OF THE FIGURES

The invention is described by way of example with reference to the accompanying Figures in which.

DESCRIPTION OF THE PREFERRED EMBODIMENTS

The invention is described with reference to embodiments. The embodiments presented are for the purpose of aiding an understanding of the invention, and the invention is not limited to any aspect of an embodiment.

Figure 1:
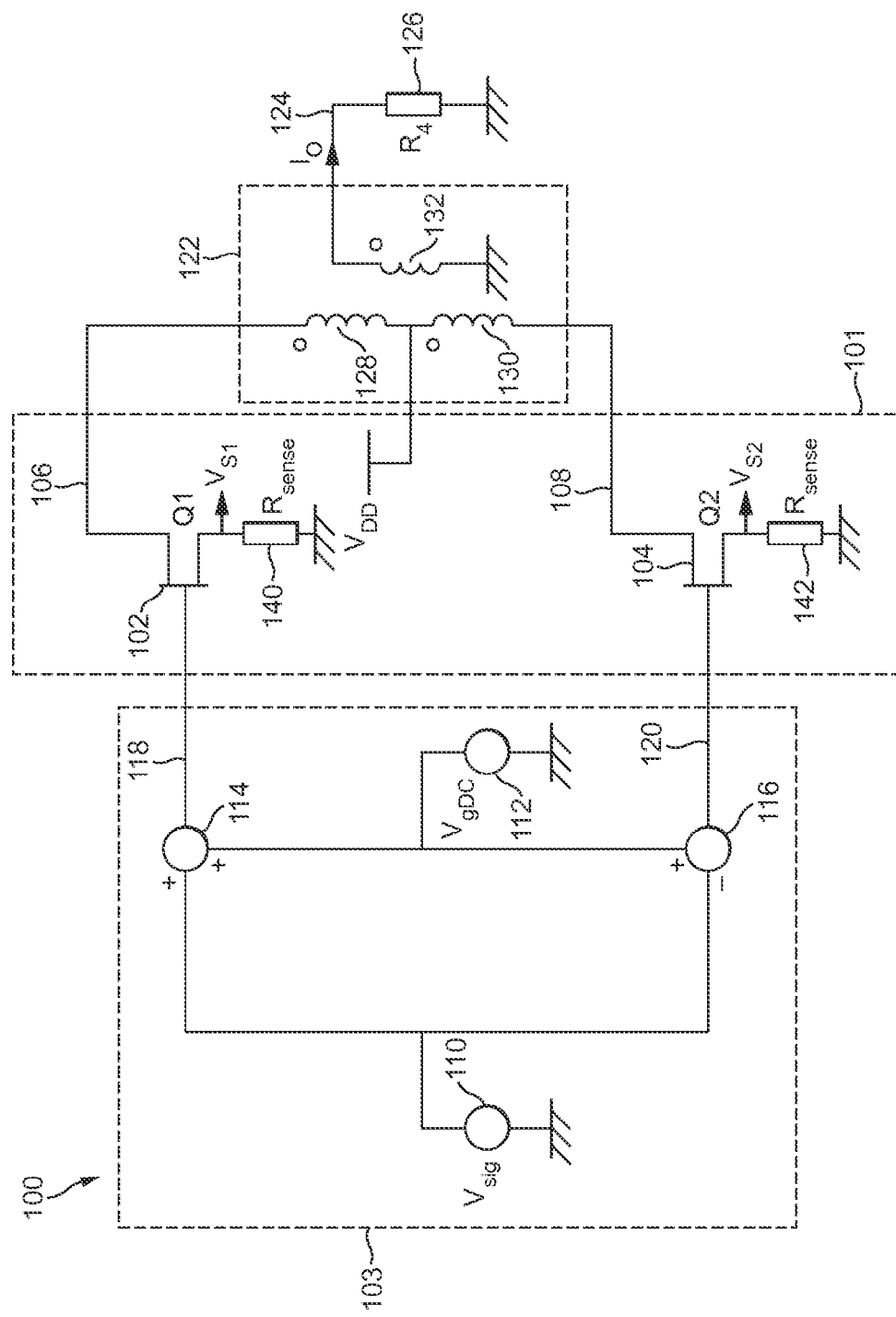
FIG. 1 illustrates an exemplary push-pull output stage.

With reference to FIG. 1 there is illustrated an output stage 100 comprising: a push-pull amplifier 101; an idealised drive circuit 103; and a combiner 122.

The drive circuit 103 is illustrated as comprising a signal voltage $V_{sig}$ source 110 and DC voltage $V_{gDC}$ source 112. A summer 114 combines signal voltage $V_{sig}$ and DC voltage $V_{gDC}$ to provide a first drive signal on line 118, representing a first part (e.g. upper half) of the signal to be amplified. A subtractor 116 subtracts the signal voltage $V_{sig}$ from the DC voltage $V_{gDC}$ to provide a second drive signal on line 120, representing a second part (e.g. lower half) of the signal to be amplified. The DC voltage $V_{gDC}$ is a common mode DC bias voltage for the transistors of the push-pull stage.

The push-pull amplifier 101 comprises output transistors 102 and 104, which are illustrated in the described embodiment as FETs. The transistor 102 receives at a gate terminal the drive signal on line 118, and the transistor 104 receives at a gate terminal the drive signal on line 120. Thus the transistor 102 amplifies the first part (e.g. upper half) of the input signal, and provides a first part (e.g. upper half) of the output signal at its drain terminal on line 106. The transistor 104 amplifies the second part (e.g. lower half) of the input signal, and provides a second part (e.g. lower half) of the output signal at its drain terminal on line 108.

The outputs on lines 106 and 108 representing the two parts (or halves) of the output signal are then combined in the combiner 122 to provide a combined output signal on line 124.

In a preferred implementation, as shown in FIG. 1, the combiner 122 comprises a transformer, having a first winding 128 on a primary side connected between the output line 106 and a supply voltage $V_{DD}$, and a second winding 130 on the primary side connected between the output line 108 and $V_{DD}$, with the primary side windings being commonly connected to $V_{DD}$. A winding 132 on a secondary side of the transformer is connected between ground and the output line 124. The output line 124 is connected to one terminal of a load 126. The other terminal of the load 126 is connected to ground. An output current $I_O$ flows in the load.

The output signal from the output stage is thus reconstructed by the combiner from the two halves and delivered to the load 126.

The arrangement of FIG. 1 as described is a known output stage arrangement.

The invention is to vary the DC bias voltage $V_{gDC}$ by a closed control loop in order to minimise variation in the quiescent bias current in the output stage, and thereby minimise crossover distortion. In order to achieve this, a technique for measuring the quiescent bias current in the output stage is required. The DC bias voltage $V_{gDC}$ can then be varied responsive to detection of a variation in the quiescent bias current, in order to seek to maintain the quiescent bias current at a constant level.

The invention is provided in a Class AB push pull amplification stage such as shown in FIG. 1, which is arranged to receive a voltage signal to be amplified and a DC bias voltage. The amplification stage comprises: a combiner to generate a sum input signal by combining the voltage signal with the DC bias voltage, and a subtractor to generate a difference input signal by subtracting the voltage signal from the DC bias voltage. The amplification stage comprises a first transistor connected to receive the sum input signal and generate a first part on an amplifier output signal, and a second transistor connected to receive the difference input signal and generate a second part of an amplifier output signal. The amplification stage further comprises a combiner for combining the first and second parts of the amplifier output signal.

Although not shown in FIG. 1, in addition an independent control loop may additionally be provided and used to control a differential DC bias on the output transistors 102 and 104.

The amplification stage in accordance with the invention is provided with a sensing circuit arranged to sense a current flowing in each of the first and second transistors. As illustrated in FIG. 1, in accordance with an embodiment of the invention, the source terminal of each transistor 102 and 104 is connected to ground via a respective sense resistor 140 and 142, each having a resistance value denoted Rsense. In embodiments, as will be described further hereinbelow a measurement or sensing of the currents flowing in the output transistors 102 and 104 is provided by measuring the voltages developed across the sense resistors 140 and 142. A sense voltage $V_{S1}$ is generated across the resistor 140, and a sense voltage $V_{S2}$ is generated across the resistor 142.

The current flowing in the output transistors 102 and 104 as determined from the sense voltages $V_{S1}$ and $V_{S2}$ does not in itself provide a measurement of the quiescent bias current of the output stage, as the signal being amplified also contributes to the DC voltage developed across the resistors 140 and 142. The amplification stage in accordance with the invention is further provided with a control circuit, as described below, to determine the quiescent of the first and second transistors in dependence on the sensed currents. An adjustment circuit is then arranged to adjust the DC bias voltage in order to minimize variation in the quiescent current.

Figure 2:
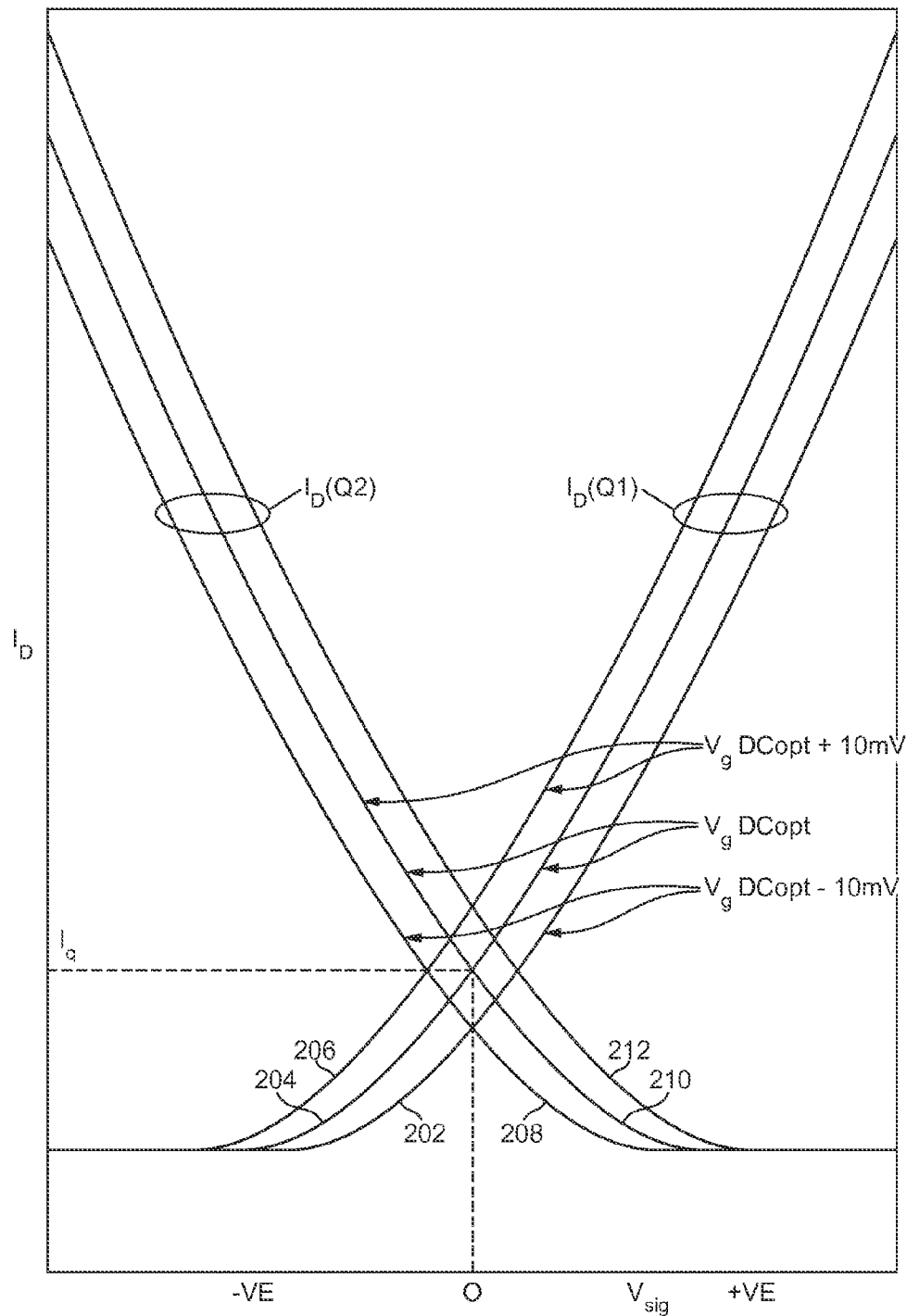
FIG. 2 and FIG. 3 illustrate the effect of varying the gate bias voltage of the arrangement of FIG. 1.
Figure 3:
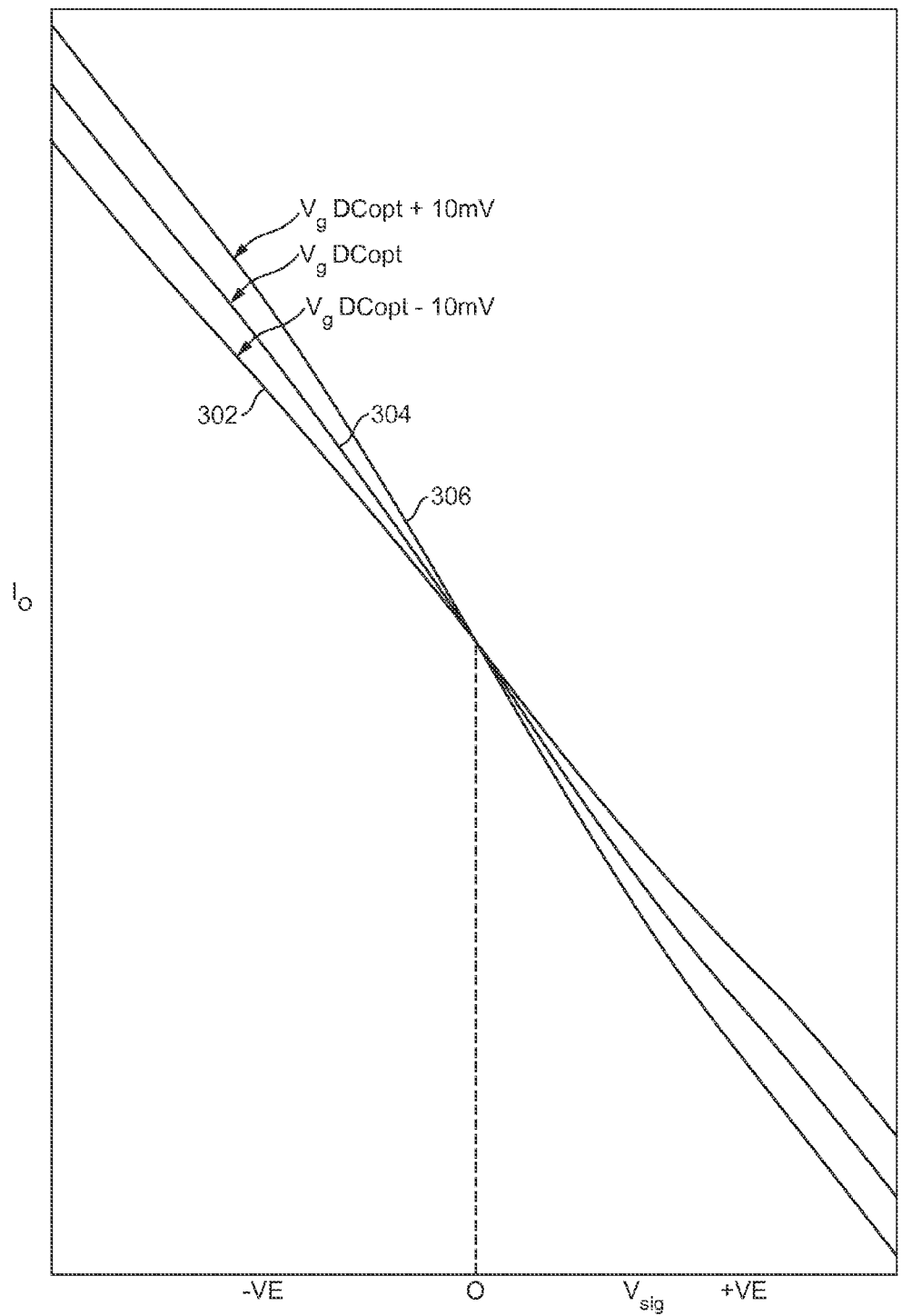

FIGS. 2 and 3 illustrate a desired bias point of the output stage 100 arrangement of FIG. 1.

FIG. 2 is a plot of the drain currents of each of the output transistors 102 and 104 against the input signal voltage $V_{sig}$. The plots illustrate the current flowing in each of the output transistors 102 and 104 for three different values of quiescent bias associated with three different values of $V_{gDC}$. The three different values of quiescent bias are an optimum bias, an under-bias, and an over-bias.

Waveforms 202, 204, 206 represent a plot of drain current against input signal voltage ($V_{SIG}$) for the output transistor 104, for different bias voltages ($V_{gDC}$). Waveforms 208, 210, 212 represent a plot of drain current against input signal voltage ($V_{SIG}$) for the output transistor 102, for different bias voltages $V_{gDC}$).

Waveform 202 is a plot of the drain current in the transistor 102 when under-biased below an optimum level by 10 mV. Waveform 208 is a plot of the drain current in the transistor 104 when under-biased below an optimum level by 10 mV.

Waveform 204 is a plot of the drain current in the transistor 102 when optimally biased. Waveform 210 is a plot of the drain current in the transistor 104 when optimally biased.

Waveform 206 is a plot of the drain current in the transistor 102 when over-biased above an optimum level by 10 mV. Waveform 212 is a plot of the drain current in the transistor 104 when over-biased above an optimum level by 10 mV.

As can be seen in FIG. 2, the crossover point between the respective drain currents occurs when the input signal voltage is zero. For the different bias voltages, the crossover point provides a different quiescent current: as can be seen the quiescent current increases as the bias voltage increases. Iq represents the optimum quiescent current associated with the optimum bias voltage.

FIG. 3 is a plot of output current ($I_O$) against the input signal voltage $V_{sig}$, and illustrates crossover distortion. The output current is the combined drain currents of the output transistors 102 and 104 (i.e. the drain currents shown in FIG. 2). FIG. 3 shows three output current waveforms 302, 304, 306 corresponding to the three bias points depicted in FIG. 2.

The waveforms of FIG. 3 include: a waveform 302 representing the output current ($I_O$) when under-biased below an optimum level by 10 mV; a waveform 304 representing the output current ($I_O$) when optimally biased; and a waveform 306 representing the output current ($I_O$) when over-biased above an optimum level by 10 mV.

The objective of the invention is to minimize non-linearities in and around the crossover region. As can be seen from FIG. 3, the lowest crossover distortion of the output waveform from the output stage is achieved when the output stage is optimally biased. Thus an objective is to achieve optimal biasing of the output stage at all times.

Figure 4:
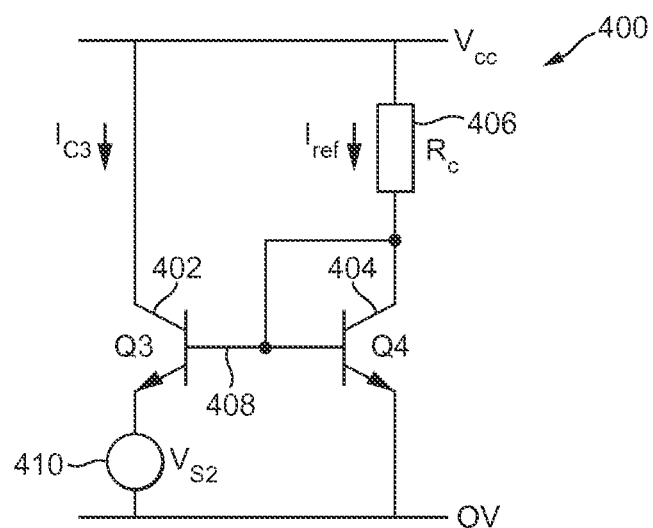
FIG. 4 illustrates a current mirror arrangement for use in an embodiment of the invention.

With reference to FIG. 4 there is illustrated a non-linear processing block for operating on one of the sensed currents in the respective first and second transistors. The non-linear processing block preferably comprises a current mirror 400 which can be used to sense the current in either one of the output stage transistors 102 and 104.

For the purposes of example, the arrangement 400 of FIG. 4 is illustrated for measuring the current in the transistor 104. A voltage source 410 represents the sensed voltage $V_{S2}$ across the resistor 142 in FIG. 1. Alternatively the voltage source could represent the sensed voltage $V_{S1}$ across the resistor 140 in FIG. 1.

A bipolar transistor 402 (also denoted Q3) is connected to have a common base connection with a bipolar transistor 404 (also denoted Q4). The collector of the transistor 402 is connected to a supply voltage Vcc, and a collector current IC3 flows in the collector of the transistor 402. The voltage source 410 is connected between the emitter of the transistor 402 and ground and represents the voltage developed across one of the series resistors shown in FIG. 1, in this example the voltage $V_{S2}$ across the sense resistor 142. The collector of the transistor 404 is connected to its base, and the emitter of the transistor 404 is connected to ground. A resistor 406 having a resistance value Rc is connected between the collector of the transistor 404 and the supply voltage Vcc. A reference current Iref flows across the resistor 406.

FIG. 4 is a known current mirror arrangement. The relationship between the sensed voltage $V_{S2}$ and the collector current IC3 is defined by the following equation:

$$I_{C3} = Iref \exp\left(\frac{-VS1}{VT}\right)$$

Where:
VT=kT/q
k=Boltzmann's constant
T=temperature (K)
Q=electron charge
$V_T$=26 mV at room temperature (300K).

Figure 5:
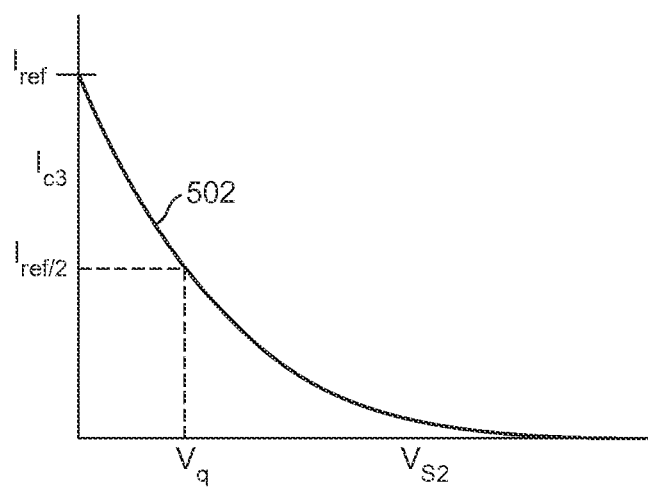
FIG. 5 illustrates the behavior of detected current in the transistor output stage with respect to input voltage.

The transfer function of this equation is plotted in FIG. 5. FIG. 5 is a plot of a waveform 502 of the collector current IC3 against the sensed voltage $V_{S2}$. It can be seen that when $V_{S2}$=0, the reference current Iref is mirrored in the collector current IC3. When $V_{S2}$ is large, the collector current IC3 drops to zero. The current drops to 50% of Iref when 0.5=exp ($-V_{S2}/V_T$), which occurs when $V_{S2}$=19 mV at room temperature.

The arrangement for FIG. 4 can be expanded to provide first and second non-linear processing blocks for operating on the sensed currents in the respective first and second transistors. Each non-linear processing block may preferably define a function for which an output tends to unity as the sensed current in the respective transistor tends to zero, and for which the output tends to zero as the sensed current in the respective transistor tends to infinity.

Thus each signal processing block implements a signal processing function $F(V_S)$, where $F(V_S)$ tends to unity as $V_S$ tends to zero, and $F(V_S)$ tends to zero as $V_S$ tends to infinity, where ($V_S$) is the respective sensed voltage.

In a push-pull amplifier, the currents in the output stage devices have an approximately reciprocal relationship to each other: when the current in one device is large, the current in the other device is small, and vice versa. Thus, the product of the sensed voltages is approximately a constant, K: $V_{S1} \cdot V_{S2} \sim K$. The value of K will vary depending upon the quiescent current.

The sum of the two non-linear processing block may be denoted by $G(V_{S1},V_{S2})=F(V_{S1})+F(V_{S2})$. This sum G has the properties of tending to unity as $V_{S1}$ tends to zero (and $V_{S2}$ tends to infinity due to the reciprocal relationship between $V_{S1}$ and $V_{S2}$); and tending to unity as $V_{S1}$ tends to infinity (and $V_{S2}$ tends to zero).

The average value of G is then only dependent upon K, and not on the amplitude of $V_{S1},V_{S2}$. This property facilitates measurement of the quiescent bias in a way which is independent of the amplitude of the signal carried by the amplifier.

A combiner is therefore preferably provided to sum the output of each of the non-linear processing blocks. The summed output of this combiner only deviates from a fixed value (i.e. K) when the amplification stage is operating in a crossover region in which both the first and second transistors are conductive.

Figure 6:
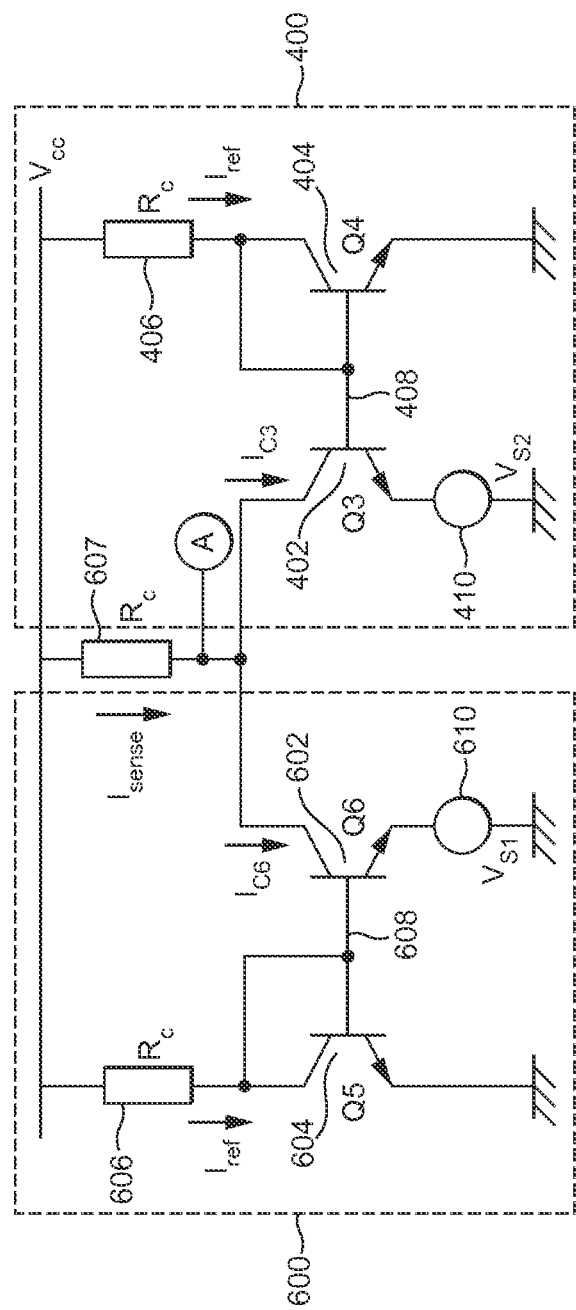
FIG. 6 illustrates a current mirror arrangement for use in an embodiment of the invention.

With reference to FIG. 6 there is illustrated an exemplary implementation of such non-linear processing blocks and a combiner.

With reference to FIG. 6, the current mirror arrangement of FIG. 4 is expanded to include a second current mirror 600 to sense the current in the other output stage transistor 102, in combination with the current mirror 400 of FIG. 4.

As illustrated the first and second non-linear processing blocks preferably each comprise a current mirror including a reference current generator and a current mirroring transistor arranged to mirror current in the reference current generator. The current in each current mirroring transistor is preferably arranged to also be dependent on one of a first and second sensed voltages representing the currents flowing in respective ones of the first and second transistors of the class AB amplifier.

As shown in FIG. 6, a bipolar transistor 602 is connected to have a common base connection with a bipolar transistor 604. The collector of the transistor 602 is connected to a supply voltage Vcc, and a collector current IC6 flows in the collector of the transistor 602. A voltage source 610 is connected between the emitter of the transistor 602 and ground. The collector of the transistor 604 is connected to its base, and the emitter of the transistor 604 is connected to ground. A resistor 606 is connected between the collector of the transistor 604 and the supply voltage VCC. The reference current Iref flows across the resistor 606.

The collector terminals of the transistors 602 and 402 are connected together, and the common connection point is connected to the supply voltage Vcc via a resistor 607. A sensed current Isense flows in the resistor 607. This connection achieves the combining of the outputs of the non-linear processing blocks, to provide the summed output.

If the value of the sense resistors 140 and 142 in FIG. 1 are chosen so that the quiescent current (i.e. the current in the output transistors 104 and 104 in the absence of a signal) of the output stages results in a 19 mV drop across the sense resistors, then the collector current IC3 flowing in transistor 402, and the collector current IC6 flowing in the transistor 602, will both be equal to Iref/2.

As such, the collector currents of the transistors 402 and 602 are summed to provide a sense current Isense equal to Iref flowing in the resistor 607. Depending on the quiescent current of the push pull amplifier, the current flowing into node A at one terminal of the resistor Rc may be different when the push pull amplifier is operating in its crossover region compared with its value when operating outside the crossover region.

Figure 7:
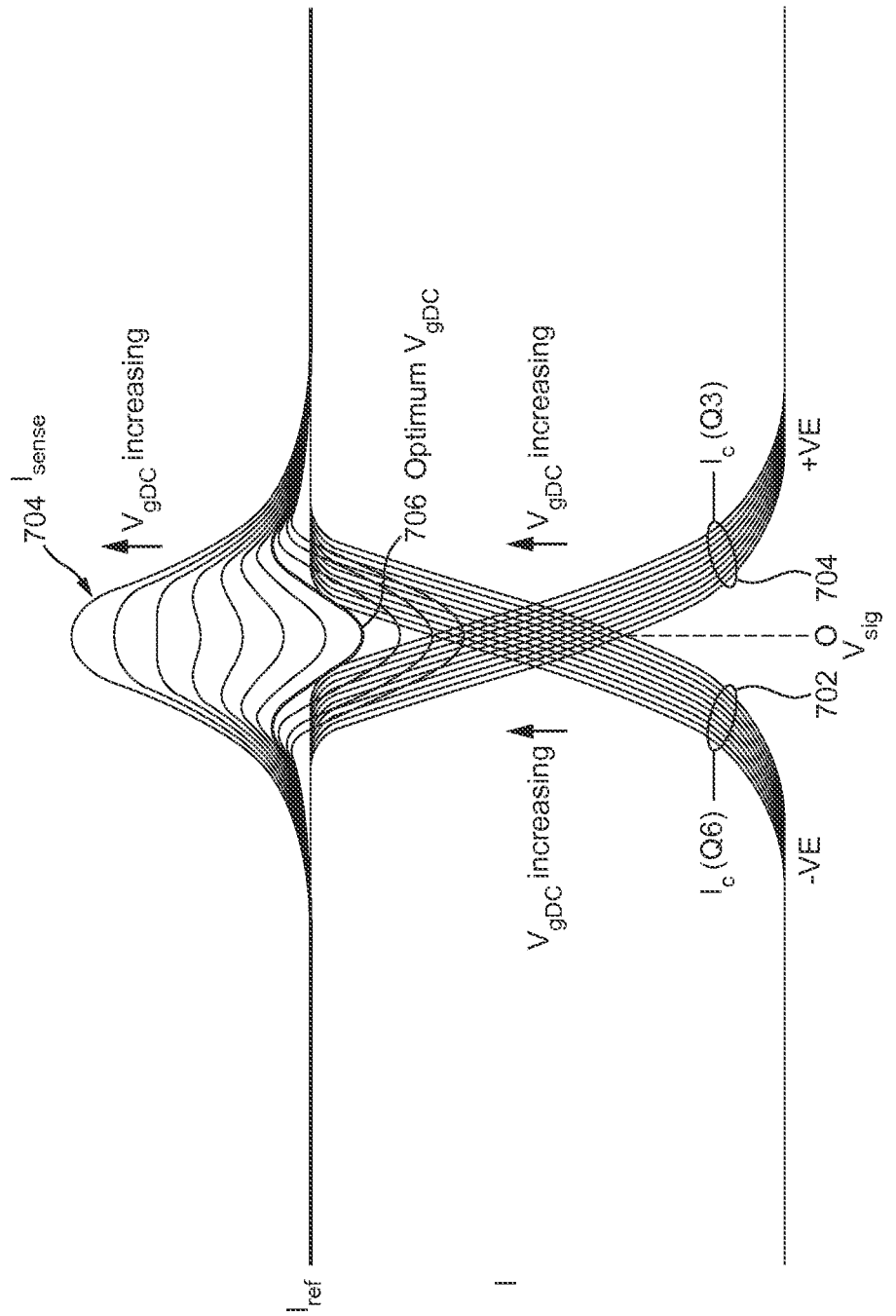
FIG. 7 illustrates the effect of varying the gate bias voltage of the arrangement of FIG. 1

FIG. 7 shows a plot of the collector currents IC3 and IC6 for several values of the voltage $V_{gDC}$. The waveforms grouped by reference numeral 702 are the plots of the collector currents IC6 associated with transistor 602. The waveforms grouped by reference numeral 704 are the plots of the collector currents IC3 associated with transistor 402. The quiescent bias is controlled by the voltage $V_{gDC}$ generated by the voltage source 112 in FIG. 1. Consistent with FIG. 2, as the bias voltage $V_{gDC}$ increases, the quiescent current increases.

Also shown in FIG. 7 are plots of the current Isense in the resistor 607, as denoted by reference numeral 704, against the input signal voltage Vsig for the same several values of the voltage $V_{gDC}$. The current Isense is the sum of the currents IC3 and IC6.

Large positive output stage signal excursions result in $V_{S1}$ being large and $V_{S2}$ being zero. In such a case the collector current IC3 is equal to Iref and the collector current IC6 is equal to zero, which also results in Isense being equal to Iref.

Large negative output stage signal excursions result in $V_{S2}$ being large and $V_{S1}$ being zero. In such case the collector current IC6 is equal to Iref and the collector current IC3 is equal to zero, which also results in Isense being equal to Iref.

Hence, for large signal excursions (positive or negative), Isense is always equal to Iref and is not dependent on the signal amplitude.

As can be seen one of the several plots 704, denoted by reference numeral 706, approximates most closely to the reference current level Iref and therefore represents the minimum crossover distortion and the optimum value of VgDC.

In practice optimum biasing occurs when the average value of the sensing current Isense is equal to the reference current Iref. If the quiescent bias it too high the average value of Isense is greater than Iref. If the quiescent bias is too low the average value of Isense of lower than Iref. As can be seen from FIG. 7, the circuit is sensitive only in the crossover region, and is insensitive to the amplitude of the input signal Vsig.

An error current, Ierr, may thus be defined which is the difference between the sensed current, Isense, and the reference current, Iref. In order to minimise crossover distortion in the output, the error current Ierr must be minimised.

In an embodiment, the error current, Ierr, can be converted into a voltage which is then integrated to provide a variable control signal for the bias voltage $V_{gDC}$ of FIG. 1, to implement closed loop control of the DC bias of output transistors 102 and 104. An example implementation of a closed loop control circuit is shown in FIG. 8.

Figure 8:
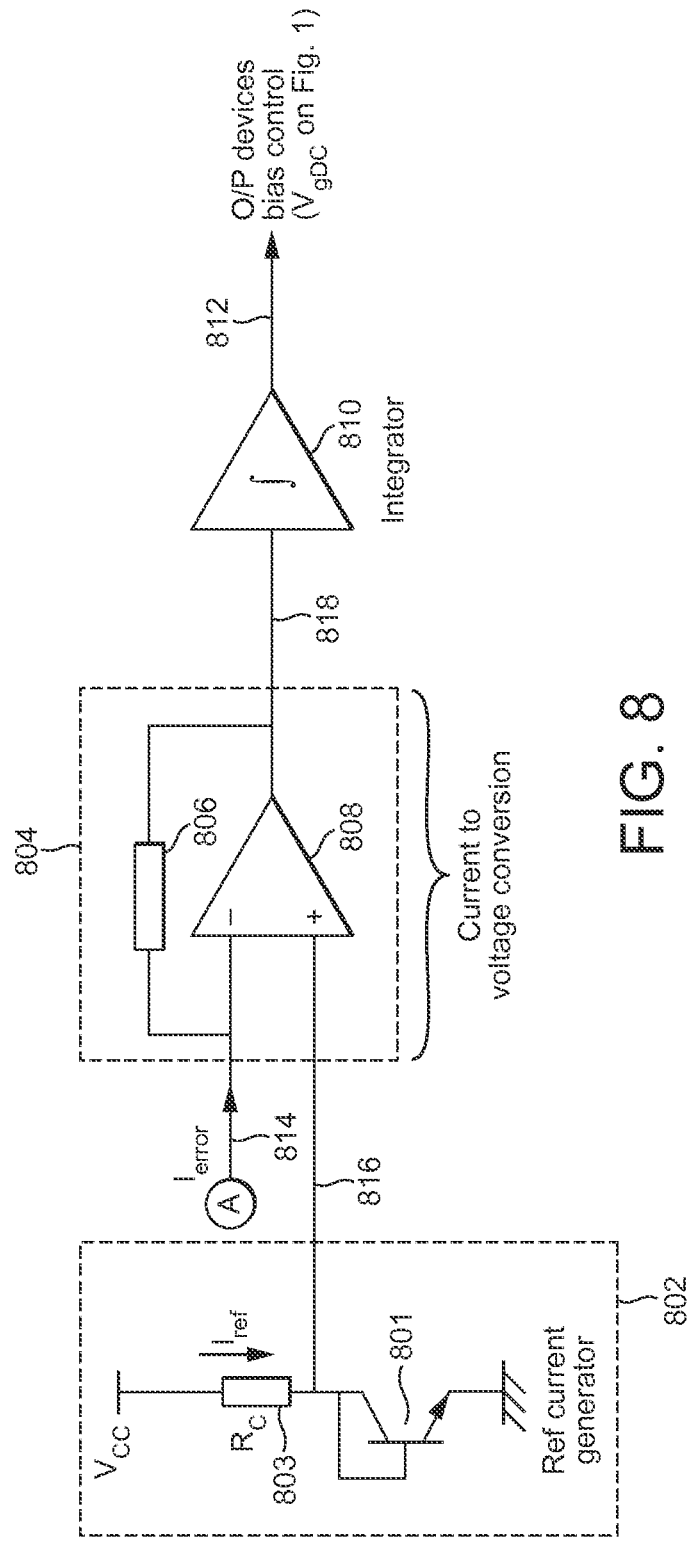
FIG. 8 illustrates a detector circuit in an embodiment of the invention.

As illustrated in FIG. 8, the closed loop control circuit includes a reference current generator 802 comprising a transistor 801 and a resistor 803. The transistor 801 is identical to the transistors 604, 602, 402, 404 in FIG. 6, and has an emitter connected to electrical ground, and a collector connected to a base. The resistor 802 is connected between the collector and Vcc. The reference current Iref is generated through the resistor 803, and is used to generate a voltage to bias the current to voltage converter 804.

The current to voltage converter 804 includes an amplifier 808 and a resistor 806. The amplifier 808 has a first input connected to the reference current generator on line 816, and a second input connected to receive the error current Ierror which is derived from the current mirror of FIG. 6, on an input line 814.

The amplifier 808 is an error amplifier 808 for receiving a current on line 814 and generating an error voltage on line 818, which is a voltage dependent on the error between the sensed and reference currents. The voltage at the output of the amplifier 808 on line 818 is thus an error voltage corresponding the error current Ierror.

The output of the amplifier 808 on line 818 is fed back to the input line 814 via resistor 806, the feedback current on line 818 being combined with the sensed current on line 814, such that the current at the input to the amplifier is modified to be the error current, representing the sensed current modified by an error amount.

The voltage output of the amplifier 808 on line 818 is then averaged by an integrator 810, which generates an average error signal on line 812. The average error signal is used to adjust the voltage $V_{gDC}$ generated by the signal generator 112 in FIG. 1. In this way, the bias voltage is controlled to minimise variation in the quiescent bias current.

The purpose of the arrangement of FIG. 8 is to integrate the error signal in order to obtain an average value of the combined outputs of the non-linear processing blocks described above. This indicates the average deviation from the fixed value K.

Figure 9:
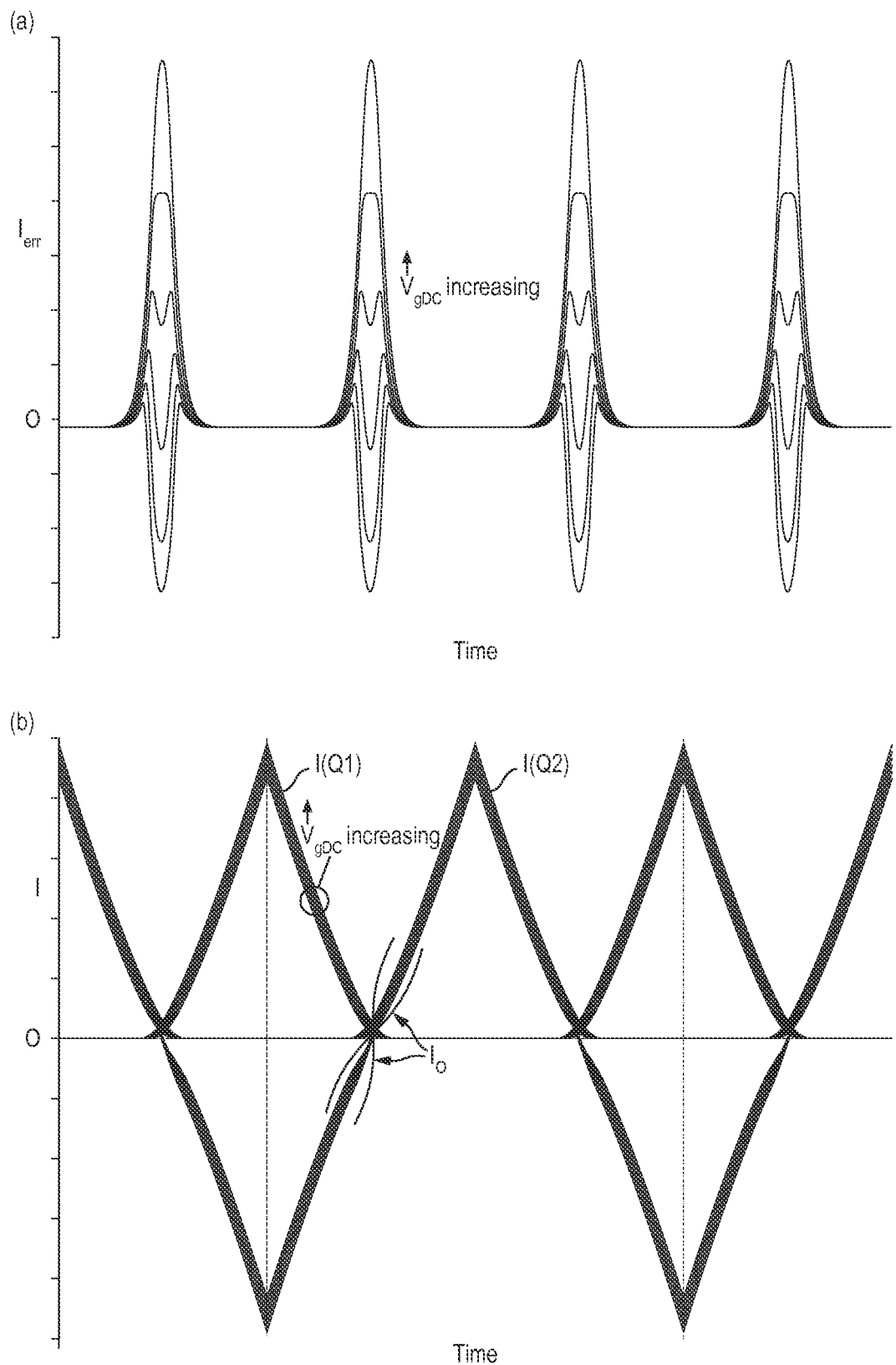
FIG. 9 illustrates the effect on an error current.

FIGS. 9(a) and 9(b) illustrate waveforms resulting from the presence of the error current.

FIG. 9(a) shows a plot of the error current Ierr against time for a triangular wave input stimulus, for different values of quiescent bias $V_{gDC}$.

FIG. 9(b) shows the corresponding currents in the output stage transistors 102 and 104, and the reconstructed output current, Io, provided by the combiner 122.

Figure 10:
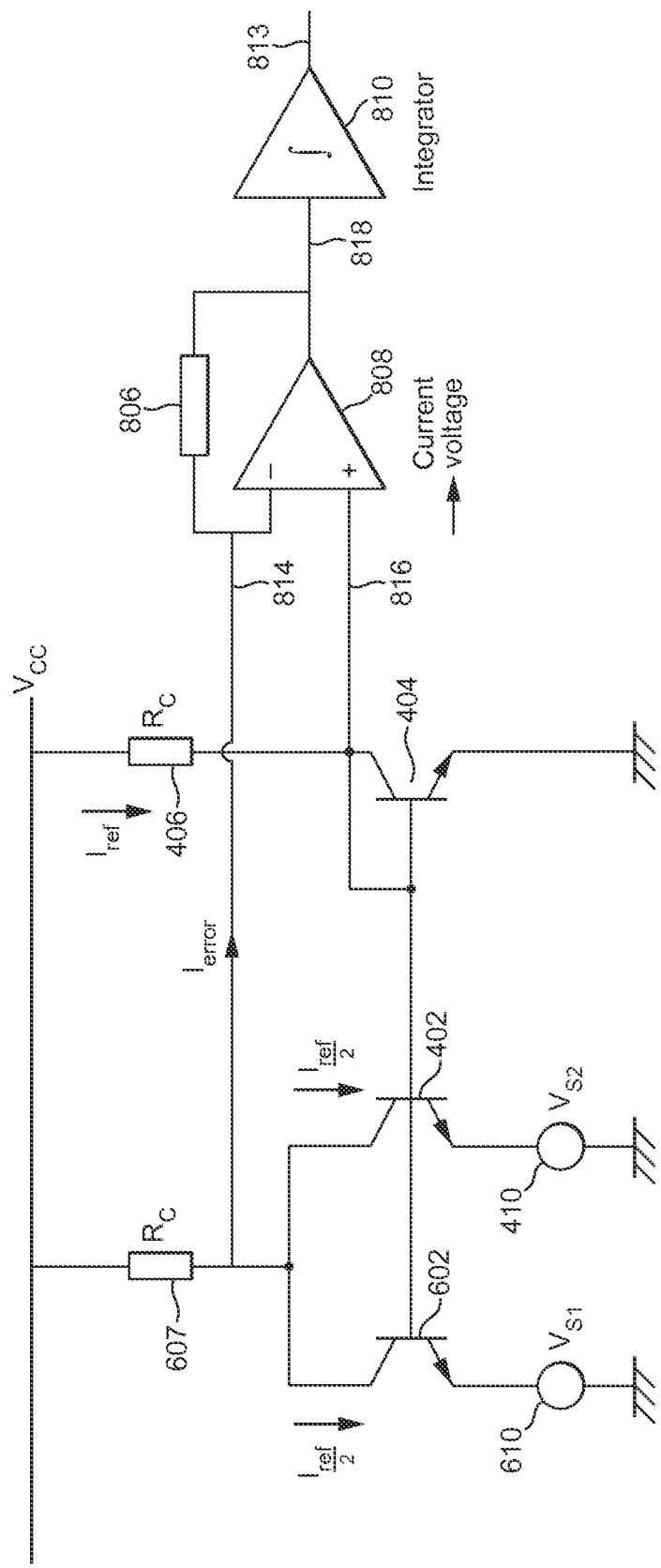
FIG. 10 illustrates an alternative to the current mirror arrangement of FIG. 6 including averaging circuitry.

FIG. 10 illustrates an alternative implementation of the current mirror arrangement of FIG. 6 and closed loop control circuit of FIG. 8, in accordance with an embodiment of the invention.

In the example implementation of FIG. 10, a single reference current generator is used for both current sensors, and is also used to generate the bias voltage for the voltage to current converter 808.

The transistors 602 and 402 of FIG. 6, the voltage sources 610 and 410 of FIG. 6, and the resistor 607 of FIG. 6 are retained.

With reference to FIG. 10, a reference current generator is provided comprised of the transistor 404 and resistor 406 of FIG. 6. This reference current generator also provides the reference current functionality provided in FIG. 6 by transistor 604 and resistor 606, and the transistor 604 and 606 are thus eliminated in this arrangement.

The base of the transistor 404 is connected to the base of the transistor 402 as in FIG. 6, and also to the base of the transistor 602.

As in FIG. 6, the current flowing in the resistor 607 is the sense current Isense which is provided on line 814 to the amplifier 808. The current flowing in resistor 406 is the reference current and is provided on line 816 to the amplifier 816.

It will be appreciated that the arrangement of FIG. 10 represents the same functionality as the arrangement of FIGS. 6 and 8, but with the component count in comparison to the current mirror arrangement of FIG. 6 reduced.

The invention has been described herein with reference to particular examples and embodiments, which are useful for understanding the invention and understanding a preferred implementation of the invention. The invention is not, however, limited to the specifics of any given embodiment, nor are the details of any embodiment mutually exclusive. The scope of the invention is defined by the appended claims.

What is claimed is:

1. A Class AB push pull amplification stage arranged to receive a voltage signal to be amplified and a DC bias voltage, the amplification stage comprising:
    a combiner to generate a sum input signal by combining the voltage signal with the DC bias voltage;
    a subtractor to generate a difference input signal by subtracting the voltage signal from the DC bias voltage;
    a first transistor connected to receive the sum input signal and generate a first part of an amplifier output signal;
    a second transistor connected to receive the difference input signal and generate a second part of an amplifier output signal;
    a combiner for combining the first and second parts of the amplifier output signal;
    a sensing circuit arranged to sense a current flowing in each of the first and second transistors;
    a control circuit arranged to determine the quiescent current of the first and second transistors in dependence on the sensed currents; and
    an adjustment circuit arranged to adjust the DC bias voltage in order to minimise variation in the quiescent current.

2. The amplification stage of claim 1 wherein the control circuit comprises:
    first and second non-linear processing blocks for operating on the sensed currents in the respective first and second transistors, wherein each non-linear processing block defines a function for which an output tends to unity as the sensed current in the respective transistor tends to zero, and the output tends to zero as the sensed current in the respective transistor tends to infinity; and
    a combiner for summing the output of each of the non-linear processing blocks, wherein the summed output only deviates from a fixed value when the amplification stage is operating in a crossover region in which both the first and second transistors are conductive.

3. The amplification stage of claim 2 wherein the average value of the summed output depends on the quiescent current of the class AB amplifier.

4. The amplification stage of claim 2 wherein the first and second non-linear processing blocks each comprise a current mirror including a reference current generator and a current mirroring transistor arranged to mirror current in the reference current generator, wherein the current in each current mirroring transistor is arranged to also be dependent on one of first and second sensed voltages representing the currents flowing in a respective one of the first and second transistors of the class AB amplifier.

5. The amplification stage of claim 4 wherein the first and second voltages are connected between the emitter or source of the respective first and second current mirroring transistors and electrical ground.

6. The amplification stage of claim 4 wherein the sensing circuit comprises first and second resistors connected to the first and second transistors of the class AB amplifier for developing the first and second voltages in dependence on the current flowing in the respective transistors.

7. The amplification stage of claim 4 wherein each reference current generator comprises a resistor in series with a diode connected transistor.

8. The amplification stage of claim 4 wherein the combiner comprises a resistor connected to the collector or drains of the first and second current mirroring transistors.

9. The amplification stage of claim 2 wherein the output of the control circuit is connected to the adjustment circuit, the adjustment circuit being arranged to use the average value of the output of the control circuit to adjust the DC bias voltage so as to minimise the deviation of the output of the control stage from the fixed value in the crossover region.

10. The amplification stage of claim 2 further comprising an integrator for determining the average value of the summed output.

11. A method of controlling the quiescent current of a Class AB push pull amplification stage which is arranged to receive a voltage signal to be amplified and a DC bias voltage, wherein the amplification stage comprises (i) a combiner to generate a sum input signal by combining the voltage signal with the DC bias voltage, (ii) a subtractor to generate a difference input signal by subtracting the voltage signal from the DC bias voltage, (iii) a first transistor connected to receive the sum input signal and generate a first part on an amplifier output signal, (iv) a second transistor connected to receive the difference input signal and generate a second part of an amplifier output signal, and (v) a combiner for combining the first and second parts of the amplifier output signal, the method comprising:

sensing a current flowing in each of the first and second transistors;

determining the quiescent current of the first and second transistors in dependence on the sensed currents; and adjusting the DC bias voltage in order to minimise variation in the quiescent current.

12. The method of claim 11 further comprising:

applying a non-linear function to each of the sensed currents, for which non-linear function an output tends to unity as the sensed current in the respective transistor tends to zero, and the output tends to zero as the sensed current in the respective transistor tends to infinity; and summing the output of each of the non-linear processing functions, wherein the summed output only deviates from a fixed value when the amplification stage is operating in a crossover region in which both the first and second transistors are conductive.

13. The method of claim 12 wherein the average value of the summed output depends on the quiescent current of the class AB amplifier.

14. The method of claim 12 wherein the first and second non-linear processing blocks each comprise a current mirror including a reference current generator and a current mirroring transistor arranged to mirror current in the reference current generator, the method further comprising arranging the current in each current mirroring transistor to be dependent on one of first and second sensed voltages representing the currents flowing in a respective one of the first and second transistors of the class AB amplifier.

15. The method of claim 14 further comprising connecting the first and second voltages between the emitter or source of the respective first and second current mirroring transistors and electrical ground.

16. The method of claim 14 wherein the sensing circuit comprises first and second resistors connected to the first and second transistors of the class AB amplifier, the method further comprising developing the first and second voltages in dependence on the current flowing in the respective transistors.

17. The method of claim 14 wherein each reference current generator comprises a resistor in series with a diode connected transistor.

18. The method of claim 14 wherein the combiner comprises a resistor connected to the collector or drains of the first and second current mirroring transistors.

19. The method of claim 12 further comprising connecting the output of the control circuit to the adjustment circuit, the adjustment circuit being arranged to use the average value of the output of the control circuit to adjust the DC bias voltage so as to minimise the deviation of the output of the control stage from the fixed value in the crossover region.

20. The method of claim 12 further comprising the step of determining the average value of the summed output in an integrator.

* * * * *